United States Patent
Mizusawa et al.

(10) Patent No.: US 9,006,960 B2
(45) Date of Patent: Apr. 14, 2015

(54) PIEZOELECTRIC VIBRATING PIECE AND PIEZOELECTRIC DEVICE

(71) Applicant: Nihon Dempa Kogyo Co., Ltd., Tokyo (JP)

(72) Inventors: Shuichi Mizusawa, Saitama (JP); Takehiro Takahashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 159 days.

(21) Appl. No.: 13/905,141

(22) Filed: May 30, 2013

(65) Prior Publication Data

US 2013/0320811 A1 Dec. 5, 2013

(30) Foreign Application Priority Data

Jun. 1, 2012 (JP) .................. 2012-125545

(51) Int. Cl.
| | |
|---|---|
| *H01L 41/047* | (2006.01) |
| *H01L 41/053* | (2006.01) |
| *H03H 9/05* | (2006.01) |
| *H03H 9/10* | (2006.01) |

(52) U.S. Cl.
CPC ........... *H01L 41/047* (2013.01); *H03H 9/0595* (2013.01); *H03H 9/1035* (2013.01)

(58) Field of Classification Search
USPC ................................. 310/348, 365
See application file for complete search history.

(56) References Cited

U.S. PATENT DOCUMENTS

| | | | | |
|---|---|---|---|---|
| 6,590,315 | B2 * | 7/2003 | Beaver .................... | 310/348 |
| 8,476,811 | B2 * | 7/2013 | Mizusawa et al. ......... | 310/348 |
| 8,531,092 | B2 * | 9/2013 | Ichikawa et al. .......... | 310/364 |
| 2012/0176004 | A1 * | 7/2012 | Mizusawa et al. ......... | 310/348 |
| 2013/0020912 | A1 * | 1/2013 | Takahashi et al. ......... | 310/344 |
| 2013/0033153 | A1 * | 2/2013 | Mizusawa et al. ......... | 310/348 |
| 2013/0043770 | A1 * | 2/2013 | Mizusawa ................ | 310/344 |
| 2013/0106247 | A1 * | 5/2013 | Ariji et al. .............. | 310/348 |

FOREIGN PATENT DOCUMENTS

JP   2009-065437   3/2009

* cited by examiner

*Primary Examiner* — Thomas Dougherty
(74) *Attorney, Agent, or Firm* — Jianq Chyun IP Office

(57) ABSTRACT

A piezoelectric vibrating piece includes a first extraction electrode and a second extraction electrode. The first extraction electrode is extracted from an excitation electrode formed on one principal surface to a framing portion via one principal surface of a connecting portion. The second extraction electrode is extracted from the extraction electrode formed on another principal surface to the framing portion via another principal surface of the connecting portion, a side surface of the connecting portion, and the one principal surface of the connecting portion. A distance between a first side and a second side at the framing portion is larger than a distance between the first side and the second side at the connecting portion. The first side is a side of the first extraction electrode at the second extraction electrode side. The second side is a side of the second extraction electrode at the first extraction electrode side.

8 Claims, 7 Drawing Sheets

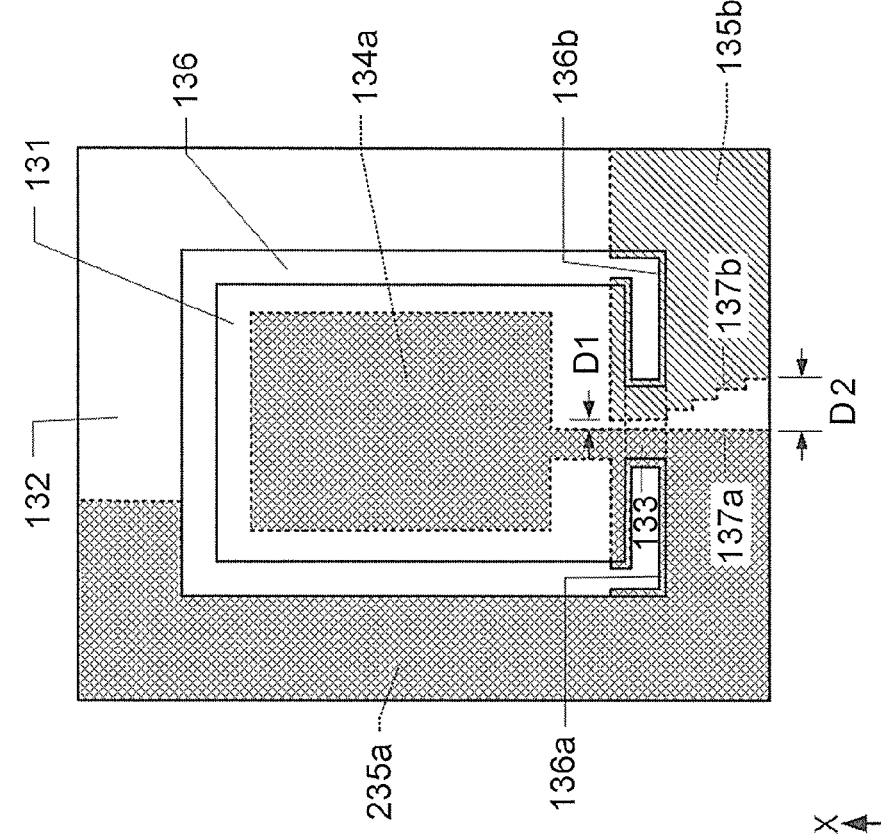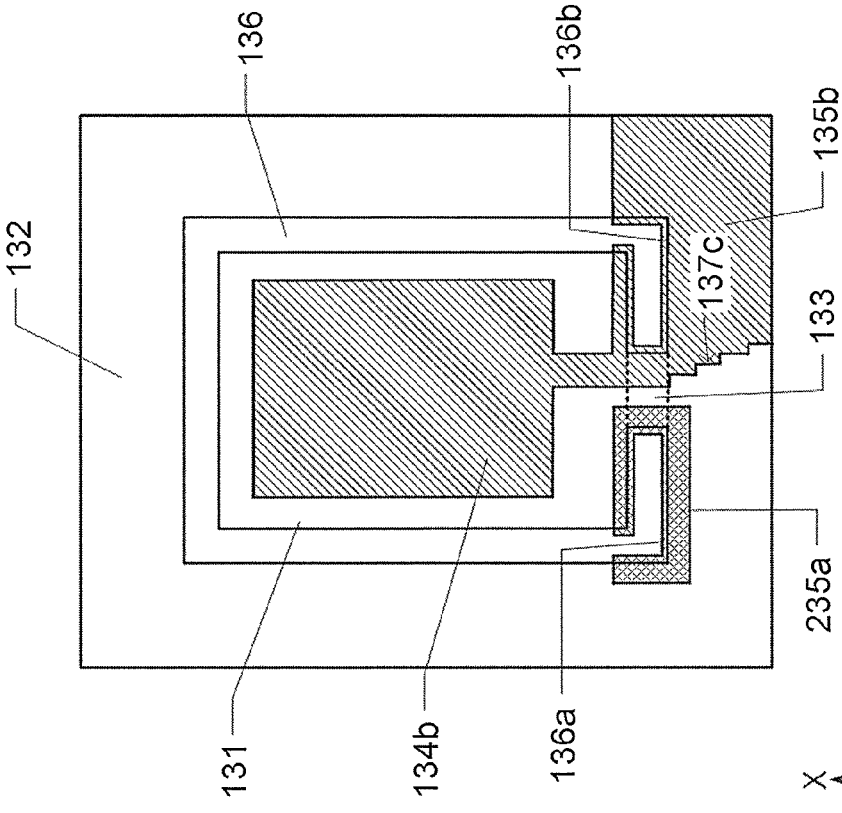

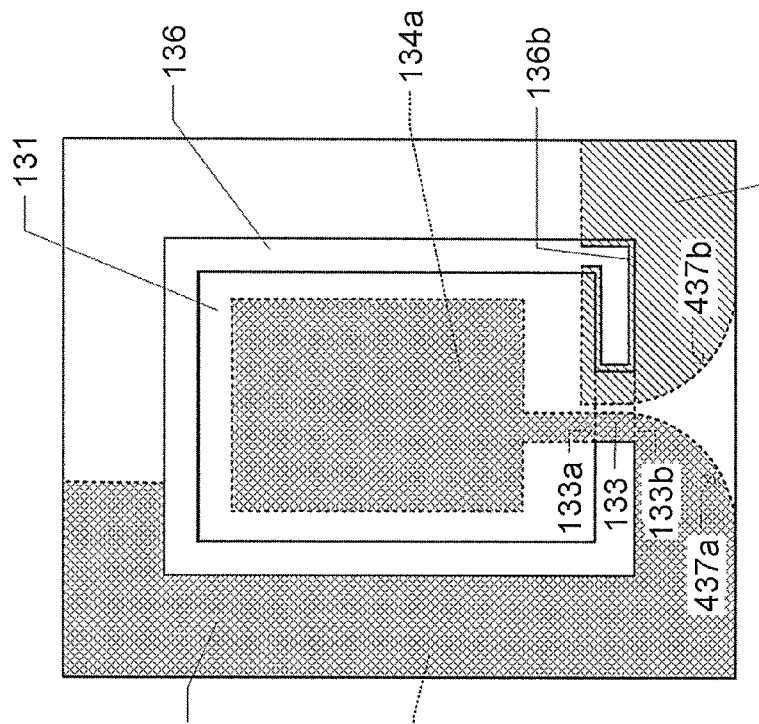
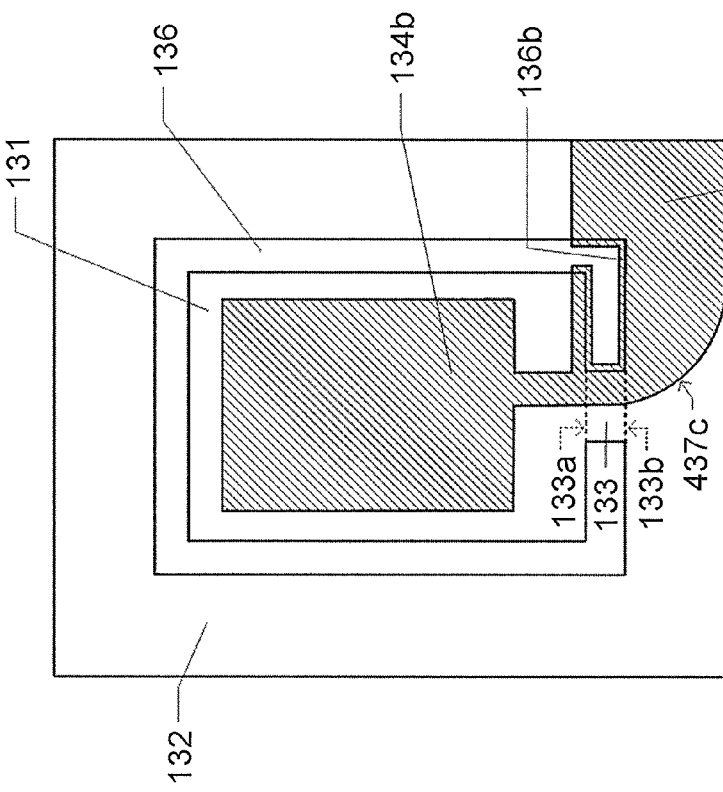
FIG. 6(a)
FIG. 6(b)

PIEZOELECTRIC VIBRATING PIECE AND PIEZOELECTRIC DEVICE

CROSS REFERENCE TO RELATED APPLICATIONS

This application claims the priority benefit of Japan application serial no. 2012-125545, filed on Jun. 1, 2012. The entirety of the above-mentioned patent application is hereby incorporated by reference herein and made a part of this specification.

TECHNICAL FIELD

This disclosure relates to a piezoelectric vibrating piece where a framing portion is formed and a piezoelectric device.

DESCRIPTION OF THE RELATED ART

A piezoelectric vibrating piece that includes a vibrator vibrating at a predetermined vibration frequency, a framing portion surrounding the vibrator, and a connecting portion connecting the vibrator and the framing portion, and a piezoelectric device that includes this piezoelectric vibrating piece are known. An excitation electrode is formed at both principal surfaces of the vibrator. An extraction electrode is extracted from each excitation electrode to the framing portion. For example, Japanese Unexamined Patent Application Publication No. 2009-65437 (hereinafter referred to as Patent Literature 1) discloses a piezoelectric vibrating piece that includes a vibrator, a framing portion, and a connecting portion connecting the vibrator and the framing portion. In the piezoelectric vibrating piece, decreasing a width of the connecting portion reduces transmission of stress, which is applied to the framing portion, to the vibrator, thus good vibration characteristics are maintained.

However, in Patent Literature 1, when a width of a connecting portion is further reduced and extraction electrodes are formed close to one another, an insulation resistance of a piezoelectric device may become low. Especially, when a bonding material is formed at the framing portion, and this bonding material is formed on the extraction electrodes close to one another to form the piezoelectric device, the insulation resistance of the piezoelectric device may be poor due to impurities included in the bonding material or similar cause.

A need thus exists for a piezoelectric vibrating piece and a piezoelectric device which are not susceptible to the drawback mentioned above.

SUMMARY

A piezoelectric vibrating piece according to a first aspect includes a vibrator, a framing portion, one connecting portion, a first extraction electrode, and a second extraction electrode. The vibrator has a rectangular shape with a short side and a long side. The vibrator includes excitation electrodes at both respective principal surfaces. The vibrator vibrates at a predetermined vibration frequency. The framing portion surrounds a circumference of the vibrator. The one connecting portion connects the vibrator and the framing portion. The first extraction electrode is extracted from the excitation electrode formed on one principal surface to the framing portion via one principal surface of the connecting portion. The second extraction electrode is extracted from the extraction electrode formed on another principal surface to the framing portion via another principal surface of the connecting portion, a side surface of the connecting portion, and the one principal surface of the connecting portion. A distance between a first side and a second side at the framing portion is larger than a distance between the first side and the second side at the connecting portion. The first side is a side of the first extraction electrode at the second extraction electrode side. The first side is from the connecting portion to the framing portion on the one principal surface. The second side is a side of the second extraction electrode at the first extraction electrode side. The second side is from the connecting portion to the framing portion on the one principal surface.

BRIEF DESCRIPTION OF THE DRAWINGS

The foregoing and additional features and characteristics of this disclosure will become more apparent from the following detailed description considered with reference to the accompanying drawings, wherein:

FIG. 4(a) is a plan view of a piezoelectric vibrating piece 230;

FIG. 4(b) is a plan view of a surface at the −Y'-axis side of the piezoelectric vibrating piece 230 viewed from the +Y'-axis side;

FIG. 6(a) is a plan view of a piezoelectric vibrating piece 430;

FIG. 6(b) is a plan view of a surface at the −Y'-axis side of the piezoelectric vibrating piece 430 viewed from the +Y'-axis side;

DETAILED DESCRIPTION

The preferred embodiments of this disclosure will be described with reference to the attached drawings. It will be understood that the scope of the disclosure is not limited to the described embodiments, unless otherwise stated.

Constitution of a Piezoelectric Device 100 according to a First Embodiment

Figure 1:
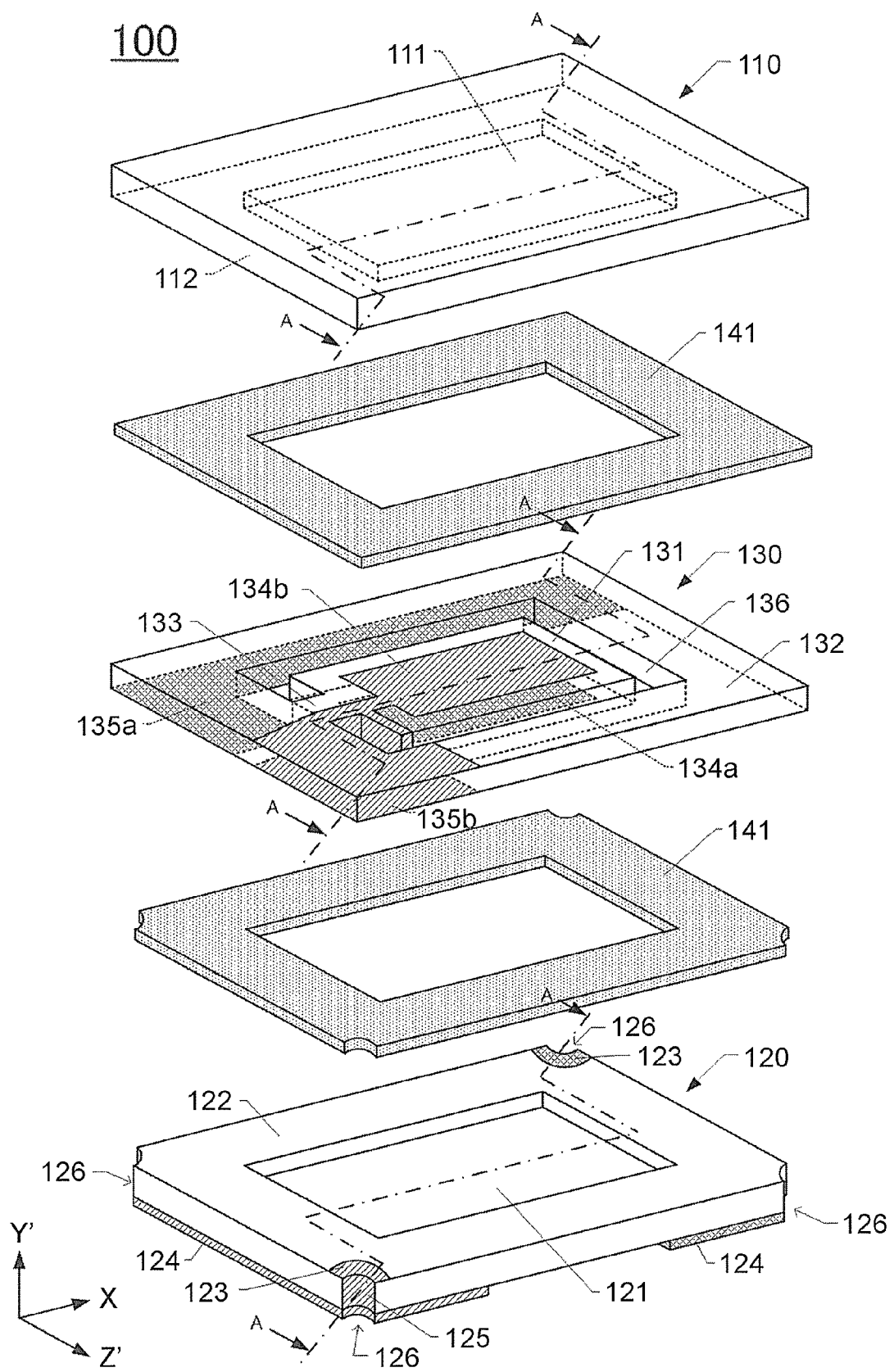
FIG. 1 is an exploded perspective view of a piezoelectric device 100.

FIG. 1 is an exploded perspective view of the piezoelectric device 100. The piezoelectric device 100 includes a lid plate 110, a base plate 120, and a piezoelectric vibrating piece 130. An AT-cut quartz-crystal vibrating piece, for example, is employed for the piezoelectric vibrating piece 130. The AT-cut quartz-crystal vibrating piece has a principal surface (in the Y-Z plane) that is tilted by 35° 15' about the Y-axis of crystallographic axes (XYZ) in the direction from the Z-axis to the Y-axis around the X-axis. In the following description, the new axes tilted with reference to the axis directions of the AT-cut quartz-crystal vibrating piece are denoted as the Y'-axis and the Z'-axis. This disclosure defines the long side direction of the piezoelectric device 100 as the X-axis direction, the height direction of the piezoelectric device 100 as the Y'-axis direction, and the direction perpendicular to the X and Y'-axis directions as the Z'-axis direction.

The piezoelectric vibrating piece 130 includes a vibrator 131, a framing portion 132, and one connecting portion 133. The vibrator 131 vibrates at a predetermined vibration frequency and has a rectangular shape. The framing portion 132 surrounds the vibrator 131. The connecting portion 133 connects the vibrator 131 and the framing portion 132. The connecting portion 133 connects the center of the side at the −X-axis side of the vibrator 131 and the framing portion 132 at the −X-axis side of the vibrator 131. In a region other than the connecting portion 133 between the vibrator 131 and the framing portion 132, a through groove 136 that passes through the piezoelectric vibrating piece 130 in the Y'-axis direction is formed. An excitation electrode 134a is formed on the surface at the −Y'-axis side of the vibrator 131. A first extraction electrode 135a is extracted from the excitation electrode 134a to the framing portion 132 through the connecting portion 133. Additionally, an excitation electrode 134b is formed on the surface at the +Y'-axis side of the vibrator 131. A second extraction electrode 135b is extracted from the excitation electrode 134b to the framing portion 132 through the connecting portion 133.

The base plate 120 includes a depressed portion 121 depressed at the −Y'-axis side, a bonding surface 122, and connecting electrodes 123 on the surface at the +Y'-axis side. The bonding surface 122 surrounds the depressed portion 121. The connecting electrodes 123 are disposed at the corner of the +X axis side and the −Z'-axis side and at the corner of the −X-axis side and the +Z'-axis side of the bonding surface 122. The bonding surface 122 is to be bonded to the surface at the −Y'-axis side of the framing portion 132 in the piezoelectric vibrating piece 130 via a bonding material 141. A pair of mounting terminals 124 is formed on the surface at the −Y'-axis side of the base plate 120. Furthermore, castellations 126 are formed at four corners of the side surfaces of the base plate 120. The castellation 126 is depressed inside of the base plate 120. Castellation electrodes 125 are formed at the side surface at the +X axis side and the −Z'-axis side and the side surface at the −X-axis side and the +Z'-axis side of the castellations 126. The castellation electrode 125 electrically connects the connecting electrode 123 and a mounting terminal 124. The connecting electrode 123 formed at the corner at the −X-axis side and at the +Z'-axis side electrically connects to the second extraction electrode 135b formed at the corner at the −X-axis side and at the +Z'-axis side on the surface at the −Y'-axis side of the piezoelectric vibrating piece 130. The connecting electrode 123 formed at the corner at the +X-axis side and at the −Z'-axis side electrically connects to the first extraction electrode 135a formed at the corner at the +X-axis side and at the −Z'-axis side on the surface at the −Y'-axis side of the piezoelectric vibrating piece 130.

The lid plate 110 includes a depressed portion 111 and a bonding surface 112 on the surface at the −Y'-axis side. The bonding surface 112 surrounds the depressed portion 111. The bonding surface 122 is to be bonded to the surface at the +Y'-axis side of the framing portion 132 in the piezoelectric vibrating piece 130 via the bonding material 141.

Figure 2:
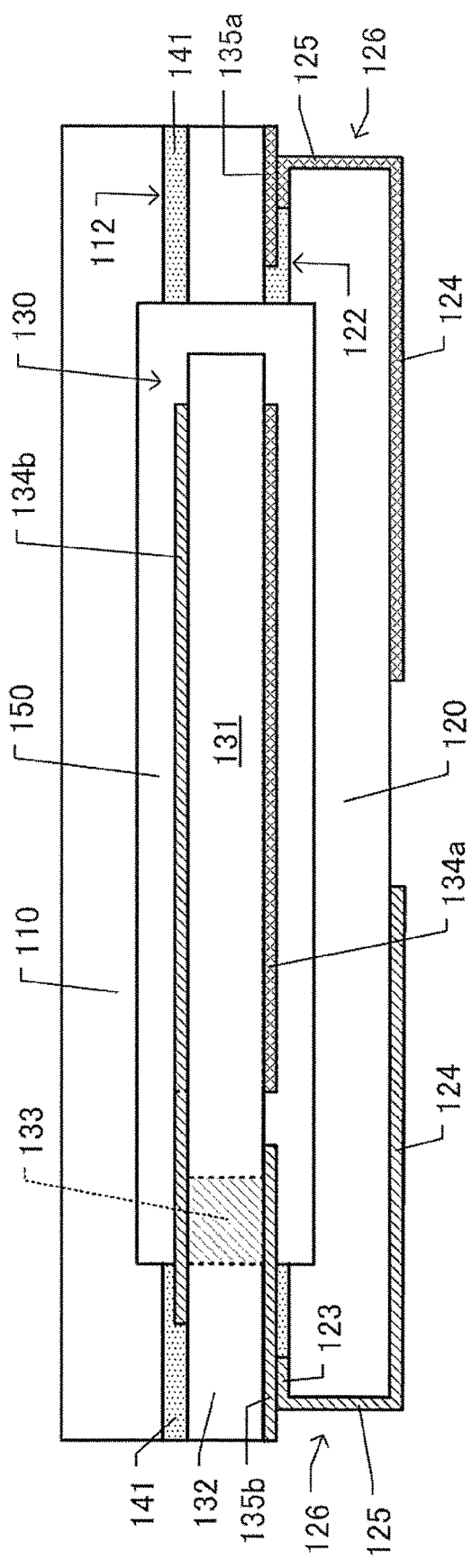
FIG. 2 is a cross-sectional view taken along the line A-A of FIG. 1.

FIG. 2 is a cross-sectional view taken along the line A-A of FIG. 1. The piezoelectric device 100 includes the lid plate 110 at the +Y'-axis side and the base plate 120 at the −Y'-axis side of the piezoelectric vibrating piece 130. Additionally, the piezoelectric device 100 includes a cavity 150 formed by the depressed portion 111 of the lid plate 110 and the depressed portion 121 of the base plate 120. The cavity 150 houses the vibrator 131 of the piezoelectric vibrating piece 130. The cavity 150 is sealed by forming the bonding materials 141 between the bonding surface 112 of the lid plate 110 and the surface at the +Y'-axis side of the framing portion 132, and between the bonding surface 122 of the base plate 120 and the surface at the −Y'-axis side of the framing portion 132. When the first extraction electrode 135a and the second extraction electrode 135b formed at the framing portion 132 electrically connects to the connecting electrode 123 formed at the base plate 120, the excitation electrode 134a and the excitation electrode 134b electrically connect to the mounting terminal 124.

Figures 3A, 3B:
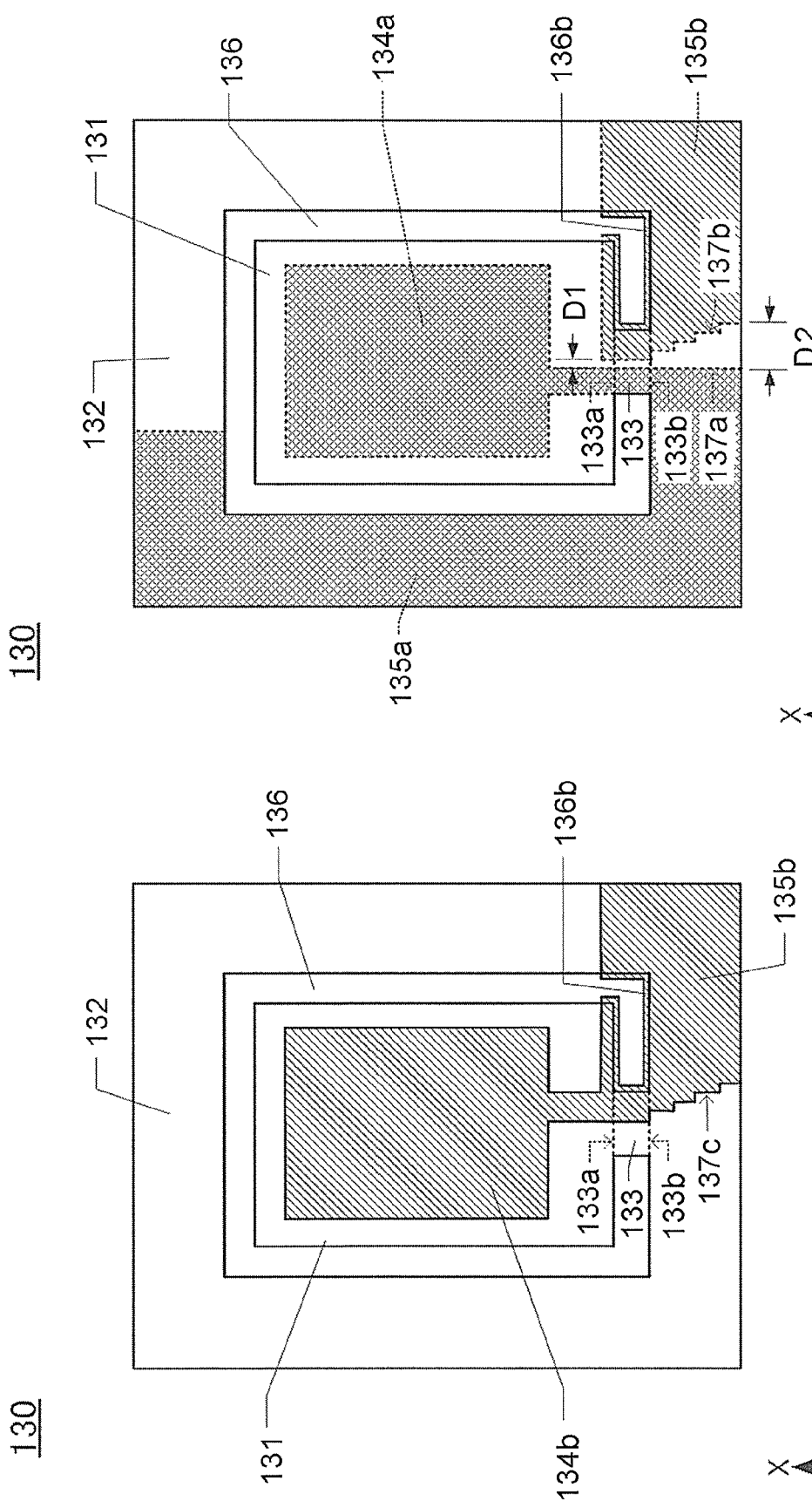
FIG. 3(a) is a plan view of a piezoelectric vibrating piece 130.
FIG. 3(b) is a plan view of a surface at the −Y'-axis side of the piezoelectric vibrating piece 130 viewed from the +Y'-axis side.

FIG. 3(a) is a plan view of the piezoelectric vibrating piece 130. The excitation electrode 134b is formed at the center of the surface at the +Y'-axis side of the vibrator 131. The second extraction electrode 135b is extracted from the excitation electrode 134b to the −X-axis side and the +Z'-axis side on the surface at the +Y'-axis side of the framing portion 132. The second extraction electrode 135b is also extracted to the surface at the −Y'-axis side of the framing portion 132 via a side surface 136b at the −X-axis side and the +Z'-axis side of the through groove 136. The side surface 136b of the through groove 136 includes a side surface at the +Z'-axis side of the connecting portion 133, a side surface at the −X-axis side of the vibrator 131 in the +Z'-axis side with respect to the connecting portion 133, and a side surface of the framing portion 132 at the −X-axis side. This side surface of the framing portion 132 at the −X-axis side faces the vibrator 131 and is disposed at the +Z'-axis side with respect to the connecting portion 133. Additionally, a third side 137c is a side at the −Z'-axis side of the second extraction electrode 135b formed on the surface at the +Y'-axis side of the framing portion 132 and the connecting portion 133. The third side 137c is formed superimposed on a second side 137b of the second extraction electrode 135b illustrated in FIG. 3(b), which will be described below, in the Y'-axis direction. The third side 137c is formed into a straight line in parallel with the X-axis between a side 133a at the +X axis side and a side 133b at the −X-axis side of the connecting portion 133. The third side 137c extends in a staircase pattern to the +Z'-axis side in the −X-axis direction at a portion at the −X-axis side of the side 133b.

FIG. 3(b) is a plan view of the surface at the −Y'-axis side of the piezoelectric vibrating piece 130 viewed from the +Y'-axis side. The first extraction electrode 135a is extracted from the excitation electrode 134a formed on the surface at the −Y'-axis side of the vibrator 131 to the surface at the −Y'-axis side of the framing portion 132 at the −X-axis side via the surface at the −Y'-axis side of the connecting portion 133. Additionally, the first extraction electrode 135a is extracted to the corner at the +X axis side and the −Z'-axis side on the surface at the −Y'-axis side of the framing portion 132 via the framing portion 132 at the −Z'-axis side. The second extraction electrode 135b is extracted from the surface at the +Y'-axis side to the −X-axis side and the +Z'-axis side on the surface at the −Y'-axis side of the framing portion 132 via the side surface 136b of the through groove 136.

On the surface at −Y'-axis side of the framing portion 132 and the connecting portion 133, the first extraction electrode 135a has a side that faces the second extraction electrode 135b, which is assumed to be a first side 137a, and the second extraction electrode 135b has a side that faces the first extraction electrode 135a, which is assumed to be a second side 137b. The first side 137a is formed into a straight line in parallel with the X-axis in the connecting portion 133 and the framing portion 132. The second side 137b is formed into a straight line in parallel with the X-axis between the side 133a and the side 133b of the connecting portion 133. The second side 137b extends in a staircase pattern to the +Z'-axis side in the −X-axis direction at the −X-axis side with respect to the side 133b of the connecting portion 133. Assume that a distance between the first side 137a and the second side 137b on the surface at the −Y'-axis side of the connecting portion 133 is assumed to be a distance D1, and a distance between the first side 137a and the second side 137b in an end at the −X-axis side of the framing portion 132 at the −X-axis side is assumed to be a distance D2. A distance between the first side 137a and the second side 137b in the framing portion 132 is formed wider than the distance D1. That is, the first side 137a and the second side 137b are separated from one another on the framing portion 132.

As illustrated in FIG. 3(b), in the piezoelectric vibrating piece 130, a single narrow width connecting portion 133 connects the side at the −X-axis side of the vibrator 131 and the framing portion 132 at the −X-axis side. Thus, in the case where a region where the connecting portion 133 connects to the vibrator 131, that is, the side 133a in the Z'-axis direction has a narrow width, a vibration generated at the vibrator 131 is less likely to be transferred to the framing portion 132. Further, since stress generated at a member such as the framing portion 132 or similar is less likely to transmit to the vibrator 131, the piezoelectric vibrating piece 130 achieves a stable vibration, which is preferred.

In the piezoelectric vibrating piece 130, the second extraction electrode 135b, which is extracted from the surface at the +Y'-axis side to the surface at the −Y'-axis side, is extracted via the side surface 136b of the through groove 136. When the second extraction electrode 135b is formed to be extracted from the surface at the +Y'-axis side and to the surface at the −Y'-axis side, a metal film, which constitutes an electrode, also attaches the region near the portion where the second extraction electrode 135b is extracted. That is, if an extraction electrode is attempted to be formed only at the inner side surface of the framing portion 132 facing the vibrator 131, a metal film is also formed at the vibrator 131 near the extraction electrode. Thus, the metal film formed at the vibrator negatively affects the vibration of the vibrator. With the piezoelectric vibrating piece 130, forming the second extraction electrode 135b on the connecting portion 133 and its periphery, which originally negatively affects the vibration, is less likely to induce a negative effect caused by forming the second extraction electrode 135b at a part of the vibrator 131.

A withstand voltage test is performed on a piezoelectric device during product testing of the piezoelectric device. For example, applying a voltage between a pair of mounting terminals can check whether the piezoelectric device has an insulation resistance of equal to or more than 500 MΩ. Then, the first extraction electrode 135a and the second extraction electrode 135b are formed in close proximity. Further, the bonding materials 141, which are formed at the +Y'-axis side and at the −Y'-axis side of the framing portion 132, possibly contain impurities or similar material. Thus, an insulation partially weakens, and the insulation resistance of the piezoelectric device becomes lower than 500 MΩ. The piezoelectric device may fail to meet the required insulation resistance standard.

With the piezoelectric device 100, the first side 137a of the first extraction electrode 135a and the second side 137b of the second extraction electrode 135b are separated from one another on the surface of the framing portion 132 where the bonding material 141 is formed, thus meeting the insulation resistance standard. Especially, with the piezoelectric vibrating piece 130, the second extraction electrode 135b extends from the side 133b of the connecting portion 133 to the end at the −X-axis side of the framing portion 132 gradually closer to the +Z'-axis side. Thus, the width of the second extraction electrode 135b is not formed large and thin, and the second extraction electrode 135b is formed so as not to have a significantly high electrical resistance. This can reduce a crystal impedance (CI), which is preferred.

Constitution of the Piezoelectric Vibrating Piece 230

With the piezoelectric vibrating piece, the first extraction electrode may be formed on the side surface of the through groove 136 and on the surface at the +Y'-axis side of the piezoelectric vibrating piece. Thus, forming the first extraction electrode broadens the surface area of the first extraction electrode and reduces the electrical resistance, thus reducing the crystal impedance (CI) of the piezoelectric device low.

FIG. 4(a) is a plan view of a piezoelectric vibrating piece 230. The piezoelectric vibrating piece 230 includes the vibrator 131, the framing portion 132, and the connecting portion 133. The excitation electrode 134b is formed on the surface at the +Y'-axis side of the vibrator 131. The second extraction electrode 135b is extracted from the excitation electrode 134b. Additionally, a first extraction electrode 235a is extracted from the surface at the −Y'-axis side to the surface at the +Y'-axis side via a side surface 136a at the −Z'-axis side at the −X-axis side of the through groove 136. The first extraction electrode 235a is formed on the surface at the +Y'-axis side around the vibrator 131, the connecting portion 133, and the side surface 136a of the through groove 136 of the framing portion 132. The side surface 136a of the through groove 136 includes a side surface at the −Z'-axis side of the connecting portion 133, a side surface at the −X-axis side of the vibrator 131 in the −Z'-axis side with respect to the connecting portion 133, and a side surface of the framing portion 132 at the −X-axis side. This side surface of the framing portion 132 at the −X-axis side faces the vibrator 131 and is disposed at the −Z'-axis side with respect to the connecting portion 133.

FIG. 4(b) is a plan view of the surface at the −Y'-axis side of the piezoelectric vibrating piece 230 viewed from the +Y'-axis side. The second extraction electrode 135b is formed at the −X-axis side and the +Z'-axis side on the surface at the −Y'-axis side of the framing portion 132 of the piezoelectric vibrating piece 230. The second extraction electrode 135b is extracted from the surface at the +Y'-axis side via the side surface 136b of the through groove 136. Additionally, the excitation electrode 134a is formed at the vibrator 131, and the first extraction electrode 235a is extracted from the excitation electrode 134a. The first extraction electrode 235a is also extracted to the surface at the +Y'-axis side via the side surface 136a of the through groove 136.

With the piezoelectric vibrating piece 230, forming the first extraction electrode 235a also on the side surface 136a of the through groove 136 and the surface at the +Y'-axis side broadens the area of the first extraction electrode 235a and reduces the electrical resistance of the first extraction electrode 235a. This reduces the crystal impedance (CI), which is preferred.

Second Embodiment

Various modifications are applicable to shapes of the first side of the first extraction electrode and the second side of the second extraction electrode. A description will be given of the modifications of the piezoelectric vibrating piece. Like reference numerals designate corresponding or identical elements throughout the first embodiment and the second embodiment, and therefore such elements will not be further elaborated here.

Constitution of a Piezoelectric Vibrating Piece 330

Figure 5:
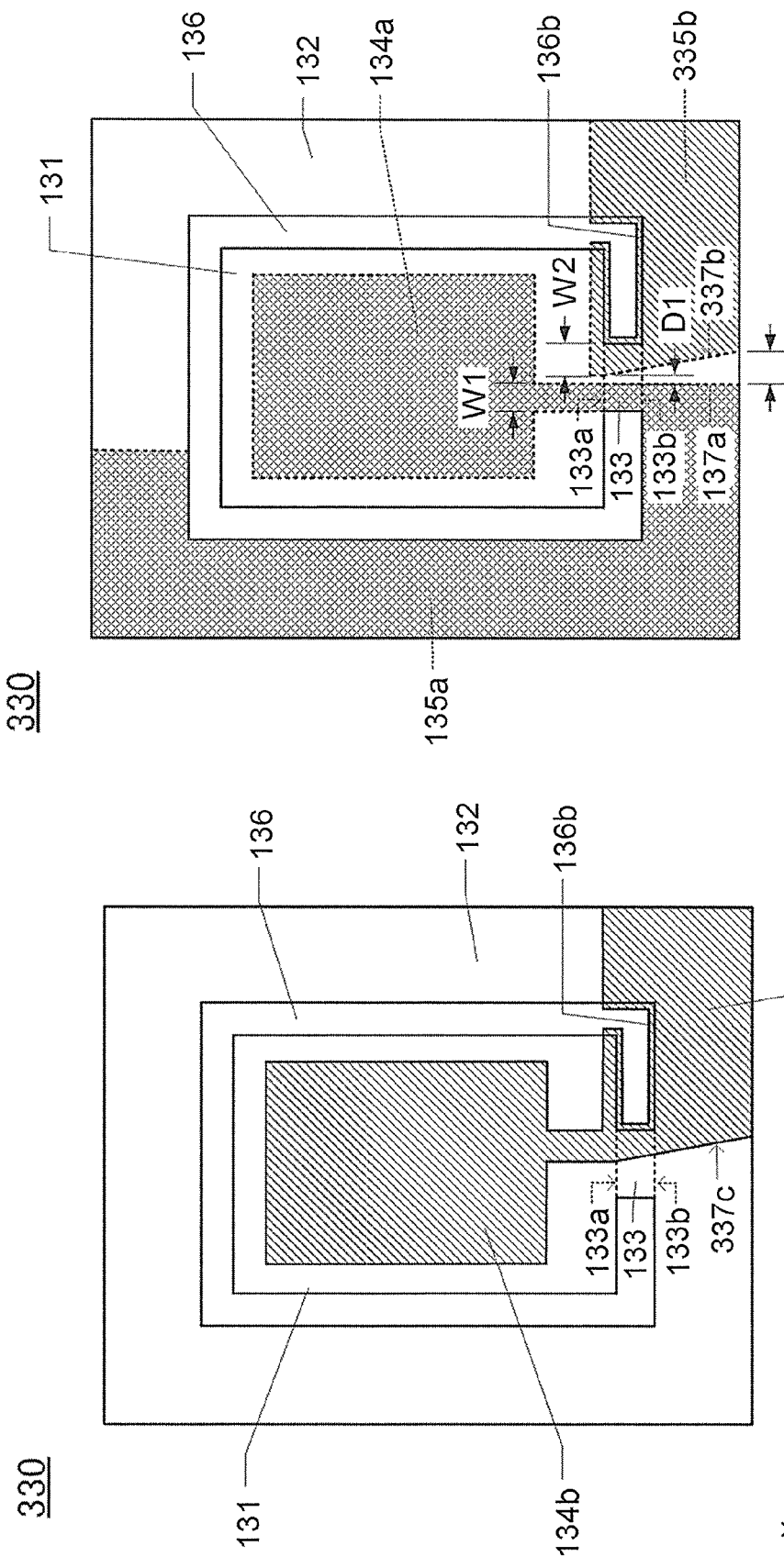
FIG. 5(a) is a plan view of a piezoelectric vibrating piece 330.
FIG. 5(b) is a plan view of a surface at the −Y'-axis side of the piezoelectric vibrating piece 330 viewed from the +Y'-axis side.

FIG. 5(a) is a plan view of the piezoelectric vibrating piece 330. The piezoelectric vibrating piece 330 includes the vibrator 131, the framing portion 132, and the connecting portion 133. The excitation electrode 134b is formed at the vibrator 131. From the excitation electrode 134b, a second extraction electrode 335b is extracted to the −X-axis side and the +Z'-axis side on the surface at the +Y'-axis side of the framing portion 132. The second extraction electrode 335b is also extracted to the surface at the −Y'-axis side of the framing portion 132 via the side surface 136b of the through groove 136. Additionally, a third side 337c is a side at the −Z'-axis side of the second extraction electrode 335b formed on the surface at the +Y'-axis side of the framing portion 132 and the connecting portion 133. The third side 337c is formed superimposed with a second side 337b of the second extraction electrode 335b illustrated in FIG. 5(b), which will be described below, in the Y'-axis direction. The third side 337c is formed in a straight line to the +Z'-axis side in the −X-axis direction at the −X-axis side with respect to the side 133a at the +X axis side of the connecting portion 133.

FIG. 5(b) is a plan view of the surface at the −Y'-axis side of the piezoelectric vibrating piece 330 viewed from the +Y'-axis side. The excitation electrode 134a is formed on the surface at the −Y'-axis side of the vibrator 131. The first extraction electrode 135a is extracted from the excitation electrode 134a. Additionally, the second extraction electrode 335b is extracted from the surface at the +Y'-axis side to the surface at the −Y'-axis side via the side surface 136b of the through groove 136. The second extraction electrode 335b is formed to the corner at the −X-axis side and the +Z'-axis side of the framing portion 132. The second side 337b of the second extraction electrode 335b is formed into a straight line and extends from the side 133a at the +X axis side of the connecting portion 133 to the +Z'-axis side in the −X-axis direction of the connecting portion 133 separated from the first side 137a. Accordingly, the distance D2, which is a distance in the Z'-axis direction between the first side 137a and the second side 337b at the end of the −X-axis side, is larger than the distance D1, which is a distance between the first side 137a and the second side 337b at the side 133a at the +X-axis side of the connecting portion 133. The distance between the first side 137a and the second side 337b at the framing portion 132 is larger than that of the connecting portion 133.

With the piezoelectric vibrating piece 330, the second side 337b of the second extraction electrode 335b is formed separated from the first side 137a, thus maintaining high insulation resistance of the piezoelectric device when the piezoelectric vibrating piece 330 is embedded into the piezoelectric device. Additionally, in the piezoelectric device, the bonding material 141 may leak out to the connecting portion 133 running out of the framing portion 132. In the piezoelectric vibrating piece 330, the first side 137a and the second side 337b are formed separately also in the connecting portion 133. Even if some of the bonding material 141 leaks to the connecting portion 133, high insulation resistance can be maintained. Moreover, by widely forming a width W2 of the second extraction electrode 335b at the side 133a at the +X axis side of the connecting portion 133 more than a width W1 of the first extraction electrode 135a, an increase in electrical resistance of the second extraction electrode 335b can be reduced by formation of the second side 337b separated from the first side 137a in the connecting portion 133.

Constitution of a Piezoelectric Vibrating Piece 430

FIG. 6(a) is a plan view of the piezoelectric vibrating piece 430. The piezoelectric vibrating piece 430 includes the vibrator 131, the framing portion 132, and the connecting portion 133. The excitation electrode 134b is formed on the surface at the +Y'-axis side of the vibrator 131. From the excitation electrode 134b, the second extraction electrode 435b is extracted to the −X-axis side and the +Z'-axis side on the surface at the +Y'-axis side of the framing portion 132. The second extraction electrode 435b is also extracted to the surface at the −Y'-axis side of the framing portion 132 via the side surface 136b of the through groove 136. Additionally, a third side 437c is a side at the −Z'-axis side of a second extraction electrode 435b formed on the surface at the +Y'-axis side of the framing portion 132 and the connecting portion 133. The third side 437c is formed superimposed with a second side 437b of the second extraction electrode 435b illustrated in FIG. 6(b), which will be described below, in the Y'-axis direction. The third side 437c is formed into a straight line in parallel with the X-axis between the side 133a at the +X axis side and the side 133b at the −X-axis side of the connecting portion 133. The third side 437c extends in a fan pattern to the +Z'-axis side in the −X-axis direction broadening in the −Z'-axis direction at the −X-axis side with respect to the side 133b.

FIG. 6(b) is a plan view of the surface at the −Y'-axis side of the piezoelectric vibrating piece 430 viewed from the +Y'-axis side. The excitation electrode 134a is formed on the surface at the −Y'-axis side of the vibrator 131. From the excitation electrode 134b, a first extraction electrode 435a is extracted to the surface at the −Y'-axis side of the framing portion 132 at the −X-axis side via the surface at the −Y'-axis side of the connecting portion 133. Further, the first extraction electrode 435a is extracted to the corner at the +X axis side and the −Z'-axis side on the surface at the −Y'-axis side of the framing portion 132 via the framing portion 132 at the −Z'-axis side. A second extraction electrode 435b is extracted from the surface at the +Y'-axis side to the −X-axis side and the +Z'-axis side on the surface at the −Y'-axis side of the framing portion 132 via the side surface 136b of the through groove 136.

Both a first side 437a of the first extraction electrode 435a and the second side 437b of the second extraction electrode 435b are formed into a straight line in parallel with the X-axis at the connecting portion 133. The first side 437a and the second side 437b are formed into a fan shape extending to the −Z'-axis side and the +Z'-axis side in the −X-axis direction separating from one another in the −X-axis side with respect to the side 133b at the −X-axis side of the connecting portion 133. Forming the first side of the first extraction electrode and the second side of the second extraction electrode separated from one another may narrow the width of each extraction electrode and may increase the electrical resistance. With the piezoelectric vibrating piece 430, forming the first side 437a and the second side 437b into a fan shape avoids an excessively narrow width of each extraction electrode, thus inhibiting an increase in electrical resistance of each extraction electrode.

Third Embodiment

With the piezoelectric vibrating piece, changing the shape of the connecting portion may further utilize features of the first embodiment and the second embodiment. A description will be given of a piezoelectric vibrating piece that includes a connecting portion with a different shape from the connecting portion 133. Like reference numerals designate corresponding or identical elements throughout the first embodiment to the third embodiment, and therefore such elements will not be further elaborated here.

Constitution of a Piezoelectric Vibrating Piece 530

Figure 7:
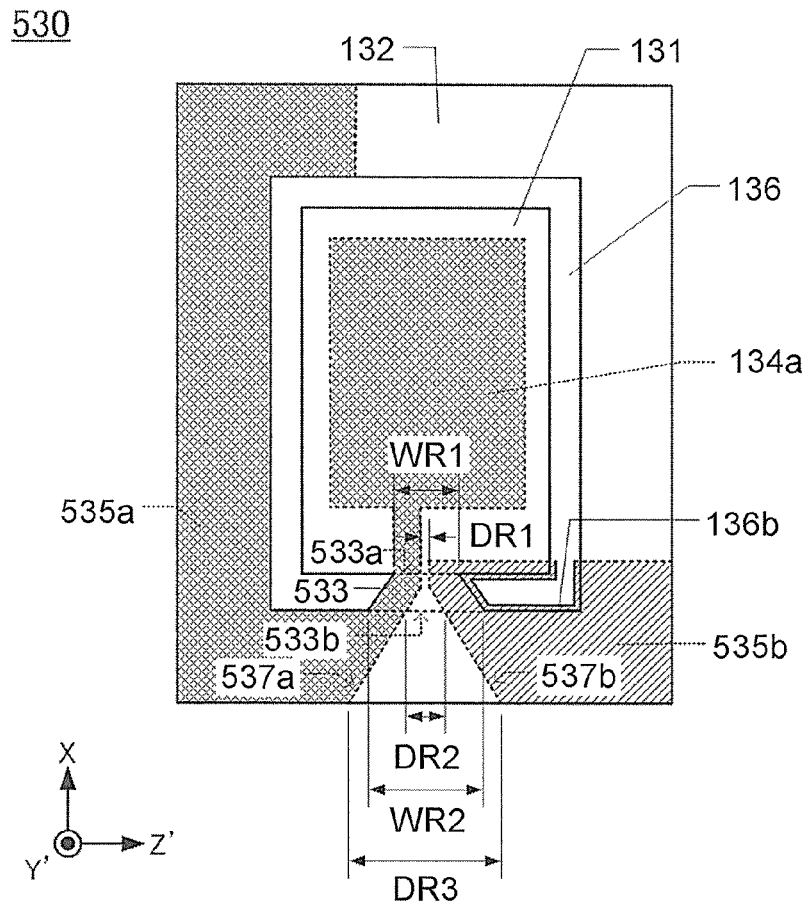
FIG. 7(a) is a plan view of a surface at the −Y'-axis side of a piezoelectric vibrating piece 530 viewed from a surface at +Y'-axis side.
FIG. 7(b) is a cross-sectional view of a piezoelectric device 200.
Figure 7:
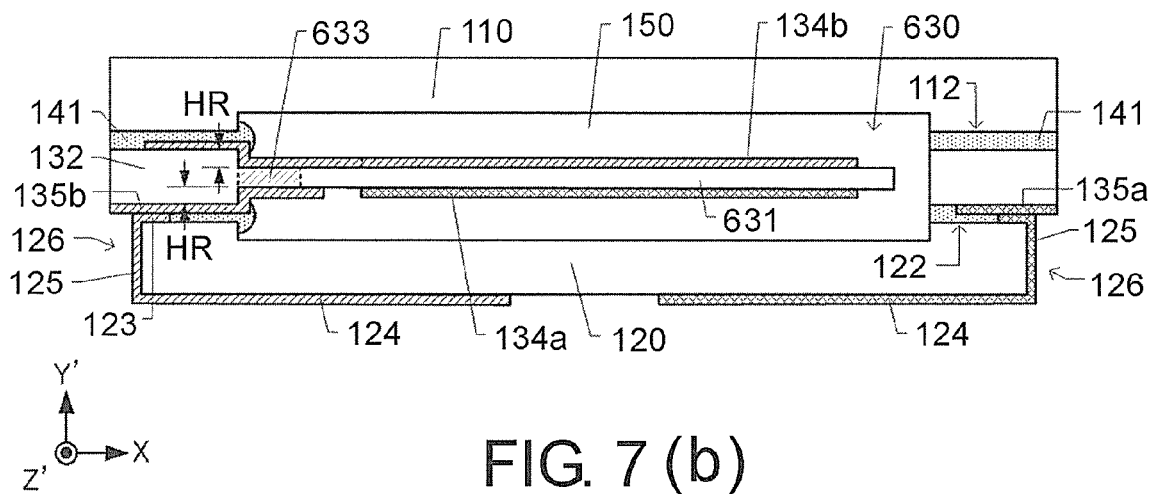

FIG. 7(a) is a plan view of the surface at the −Y'-axis side of the piezoelectric vibrating piece 530 viewed from the surface at +Y'-axis side. The piezoelectric vibrating piece 530 includes the vibrator 131, the framing portion 132, and a connecting portion 533. The connecting portion 533 connects the center of the side at the −X-axis side of the vibrator 131 and the −X-axis side of the framing portion 132. The connecting portion 533 includes a side 533b at the −X-axis side and a side 533a at the +X axis side. The side 533b has a width WR2 in the Z'-axis direction, which is larger than a width WR1 of the side 533a in the Z'-axis direction. Additionally, a first side 537a of a first extraction electrode 535a extends into a straight line from the proximity of the side 533a at the +X axis side of the connecting portion 533 to the −Z'-axis side in the −X-axis direction. A second side 537b of the second extraction electrode 535b extends into a straight line from the proximity of the side 533a at the +X axis side of the connecting portion 533 to the Z'-axis side in the −X-axis direction. The first side 537a and the second side 537b are formed separated from one another. Accordingly, a distance DR3, which is a distance between the first side 537a and the second side 537b at the end of the −X-axis side is larger than a distance DR2, which is a distance between the first side 537a and the second side 537b at the side 533b of the connecting portion 533. The distance DR2 is formed larger than a distance DR1, which is a distance between the first side 537a and the second side 537b at the side 533a of the connecting portion 533.

In the piezoelectric vibrating piece 530, the distance DR2 is formed larger than the distance DR1. Accordingly, even if the first side 537a of the first extraction electrode 535a and the second side 537b of a second extraction electrode 535b are formed separated from one another at the connecting portion 533, the width of each extraction electrode is not formed narrow, thus preventing high electrical resistance of each extraction electrode.

Constitution of a Piezoelectric Device 200

FIG. 7(b) is a cross-sectional view of the piezoelectric device 200. The piezoelectric device 200 includes a piezoelectric vibrating piece 630, the lid plate 110, and the base plate 120. The lid plate 110 is disposed at the +Y'-axis side of the piezoelectric vibrating piece 630. The base plate 120 is disposed at the −Y'-axis side of the piezoelectric vibrating piece 630. The piezoelectric vibrating piece 630 includes a vibrator 631, the framing portion 132, and a connecting portion 633. The piezoelectric vibrating piece 630 has a planar shape similar to the piezoelectric vibrating piece 130 illustrated in FIG. 3(a) and FIG. 3(b). The vibrator 631 and the connecting portion 633 are formed thinner than the vibrator 131 and the connecting portion 633 in the Y' axis direction. The vibrator 631 and the connecting portion 633 have surfaces at the +Y'-axis side depressed from the +Y'-axis side of the framing portion 132 in the −Y'-axis direction by a height HR. The vibrator 631 and the connecting portion 633 have surfaces at the −Y'-axis side depressed from the −Y'-axis side of the framing portion 132 in the +Y'-axis direction by the height HR. In the piezoelectric device 200, the surface at the −Y'-axis side of the connecting portion 633 separates from the surface at the −Y'-axis side of the framing portion 132 by the height HR. Thus, the bonding material 141 which leaks to the cavity 150 is less likely to reach the connecting portion 633. Accordingly, contact between an extraction electrode formed at the connecting portion 633 and the bonding material 141 is less likely to occur, thus preventing a reduction in the insulation resistance of the piezoelectric device 200.

Representative embodiments are described in detail above; however, as will be evident to those skilled in the relevant art, this disclosure may be changed or modified in various ways within its technical scope.

For example, the above-described embodiments disclose a case where the piezoelectric vibrating piece is an AT-cut quartz-crystal vibrating piece. A BT-cut quartz-crystal vibrating piece or a similar member that similarly vibrates in the thickness-shear mode is similarly applicable. Further, the piezoelectric vibrating piece is basically applicable to a bonding material that includes not only a quartz-crystal material but also lithium tantalate, lithium niobate, and piezoelectric ceramics.

In the first aspect of the disclosure, the piezoelectric vibrating piece according to a second aspect is configured as follows. The connecting portion connects a center part of the short side of the vibrator.

In the first aspect and the second aspect of the disclosure, the piezoelectric vibrating piece according to a third aspect is configured as follows. The first extraction electrode has a width at the connecting portion on the one principal surface. The width is narrower than a width of the second extraction electrode at the connecting portion on the one principal surface.

In the first aspect to the third aspect of the disclosure, the piezoelectric vibrating piece according to a fourth aspect is configured as follows. One side of the first side and the second side extends in a direction of the long side. Another side is formed into a straight line from the connecting portion to the framing portion separated from the one side.

In the first aspect to the third aspect of the disclosure, the piezoelectric vibrating piece according to a fifth aspect is configured as follows. At least an end of the first side and an end of the second side is formed into a fan shape at the framing portion.

In the first aspect to the third aspect of the disclosure, the piezoelectric vibrating piece according to a sixth aspect is configured as follows. At least one of the first side and the second side at the framing portion is formed in a staircase pattern.

In the first aspect to the sixth aspect of the disclosure, the piezoelectric vibrating piece according to a seventh aspect is configured as follows. The first extraction electrode is extracted from the connecting portion to the framing portion. The first extraction electrode is extracted to the framing portion at an opposite side with respect to the vibrator.

The piezoelectric device according to an eighth aspect is configured as follows. The piezoelectric device includes the piezoelectric vibrating piece according to the first aspect to the seventh aspect of the disclosure, a base plate to be bonded on the one principal surface of the framing portion, and a lid plate to be bonded on the other principal surface of the framing portion to seal the vibrator.

With the piezoelectric vibrating piece and the piezoelectric device according to the embodiments, poor insulation resistance can be prevented.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric vibrating piece, comprising:
   a vibrator, having a rectangular shape with a short side and a long side, the vibrator including excitation electrodes at both respective principal surfaces, the vibrator vibrating at a predetermined vibration frequency;
   a framing portion, surrounding a circumference of the vibrator;
   one connecting portion, connecting the vibrator and the framing portion;
   a first extraction electrode, being extracted from the excitation electrode formed on one principal surface to the framing portion via one principal surface of the connecting portion; and
   a second extraction electrode, being extracted from the extraction electrode formed on another principal surface to the framing portion via another principal surface of the connecting portion, a side surface of the connecting portion, and the one principal surface of the connecting portion, wherein
   a distance between a first side and a second side at the framing portion is larger than a distance between the first side and the second side at the connecting portion,
   the first side is a side of the first extraction electrode at the second extraction electrode side, the first side being from the connecting portion to the framing portion on the one principal surface, and
   the second side is a side of the second extraction electrode at the first extraction electrode side, the second side being from the connecting portion to the framing portion on the one principal surface.

2. The piezoelectric vibrating piece according to claim 1, wherein
   the connecting portion connects a center part of the short side of the vibrator.

3. The piezoelectric vibrating piece according to claim 1, wherein
   the first extraction electrode has a width at the connecting portion on the one principal surface, the width being narrower than a width of the second extraction electrode at the connecting portion on the one principal surface.

4. The piezoelectric vibrating piece according to claim 1, wherein
   one side of the first side and the second side extends in a direction of the long side, and
   another side is formed into a straight line from the connecting portion to the framing portion separated from the one side.

5. The piezoelectric vibrating piece according to claim 1, wherein
   at least an end of the first side and an end of the second side is formed into a fan shape at the framing portion.

6. The piezoelectric vibrating piece according to claim 1, wherein
   at least one of the first side and the second side at the framing portion is formed in a staircase pattern.

7. The piezoelectric vibrating piece according to claim 1, wherein
   the first extraction electrode is extracted from the connecting portion to the framing portion, the first extraction electrode being extracted to the framing portion at an opposite side with respect to the vibrator.

8. A piezoelectric device, comprising:
   the piezoelectric vibrating piece according to claim 1;
   a base plate, being bonded on the one principal surface of the framing portion; and
   a lid plate, being bonded on the other principal surface of the framing portion to seal the vibrator.

* * * * *